United States Patent
Voss et al.

(10) Patent No.: US 9,955,596 B2
(45) Date of Patent: Apr. 24, 2018

(54) PCBA CARTRIDGE SUB-ASSEMBLY

(71) Applicant: Seagate Technology LLC, Cupertino, CA (US)

(72) Inventors: William Gunther Voss, Rosemount, MN (US); Donald R. Bloyer, Eden Prairie, MN (US); Nathan Loren Lester, Golden Valley, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/233,410

(22) Filed: Aug. 10, 2016

(65) Prior Publication Data

US 2018/0049331 A1 Feb. 15, 2018

(51) Int. Cl.
| | |
|---|---|
| *H05K 5/03* | (2006.01) |
| *H05K 5/00* | (2006.01) |
| *H05K 1/02* | (2006.01) |
| *H05K 1/14* | (2006.01) |
| *H05K 3/36* | (2006.01) |
| *H05K 5/02* | (2006.01) |

(52) U.S. Cl.
CPC ......... *H05K 5/0069* (2013.01); *H05K 1/0201* (2013.01); *H05K 1/142* (2013.01); *H05K 1/144* (2013.01); *H05K 1/147* (2013.01); *H05K 3/361* (2013.01); *H05K 3/368* (2013.01); *H05K 5/0217* (2013.01); *H05K 5/03* (2013.01); *H05K 2201/042* (2013.01); *H05K 2201/10159* (2013.01); *H05K 2201/10409* (2013.01)

(58) Field of Classification Search
CPC ....... H05K 5/0069; H05K 1/142; H05K 3/361
USPC ................ 361/704, 737, 760, 742, 810, 689
See application file for complete search history.

(56) References Cited

U.S. PATENT DOCUMENTS

| | | | |
|---|---|---|---|
| 4,527,312 | A | 7/1985 | Ruehl et al. |
| 5,008,777 | A | 4/1991 | Burns |
| 5,168,430 | A | 12/1992 | Nitsch et al. |
| 5,709,557 | A | 1/1998 | Martin et al. |

(Continued)

FOREIGN PATENT DOCUMENTS

| | | |
|---|---|---|
| WO | 99/66499 A1 | 12/1999 |
| WO | 2007/079534 A1 | 7/2007 |

OTHER PUBLICATIONS

"Rigid-Flex", Rigid-Flex—Samsung Electra-Mechanics, downloaded from http://www.samsungsem.com/global/product/pcb/rigid-flexlindex.jsp, 9 pages, downloaded on May 6, 2016.

(Continued)

*Primary Examiner* — Dion R Ferguson
*Assistant Examiner* — Mandeep S Buttar
(74) *Attorney, Agent, or Firm* — Kagan Binder, PLLC

(57) ABSTRACT

A memory cartridge for use during assembly of a storage drive apparatus. The memory cartridge includes a first memory printed circuit board (PCB). The memory cartridge also includes a second memory PCB, where the second memory PCB is operatively coupled to the first memory PCB by a first flexible connection. The memory cartridge also includes a chassis configured to fasten to the first memory PCB and to the second memory PCB such that the first and second memory PCBs have a spaced relationship to each other, and where the spaced relationship defines a gap.

20 Claims, 7 Drawing Sheets

(56) References Cited

U.S. PATENT DOCUMENTS

| | | | | |
|---|---|---|---|---|
| 6,049,467 | A * | 4/2000 | Tamarkin | H01L 25/105 |
| | | | | 174/535 |
| 6,520,789 | B2 * | 2/2003 | Daugherty, Jr. | H01R 12/62 |
| | | | | 439/329 |
| 7,320,609 | B1 | 1/2008 | Minich | |
| 8,091,218 | B2 | 1/2012 | Momota et al. | |
| 8,149,583 | B2 * | 4/2012 | Ishii | H05K 3/368 |
| | | | | 361/679.31 |
| 8,233,282 | B2 | 7/2012 | Chen et al. | |
| 2006/0067066 | A1 * | 3/2006 | Meier | G06F 1/184 |
| | | | | 361/785 |
| 2006/0232948 | A1 * | 10/2006 | Haager | H05K 7/1417 |
| | | | | 361/752 |
| 2010/0008034 | A1 | 1/2010 | Hinkle | |
| 2011/0211310 | A1 | 9/2011 | Farling et al. | |
| 2014/0211421 | A1 * | 7/2014 | Mishrikey | H05K 1/0209 |
| | | | | 361/717 |
| 2015/0261265 | A1 * | 9/2015 | Dean | G06F 1/20 |
| | | | | 361/679.31 |

OTHER PUBLICATIONS

PCB Layer Stack Management, Modified on Nov. 6, 2013, PCB Layer Stack Management Online Documentation for Altium Products, downloaded from http://techdocs.altium.com/display/ADOH/PCB+Layer+Stack+Manag, 10 pages, downloaded on May 5, 2016.

* cited by examiner

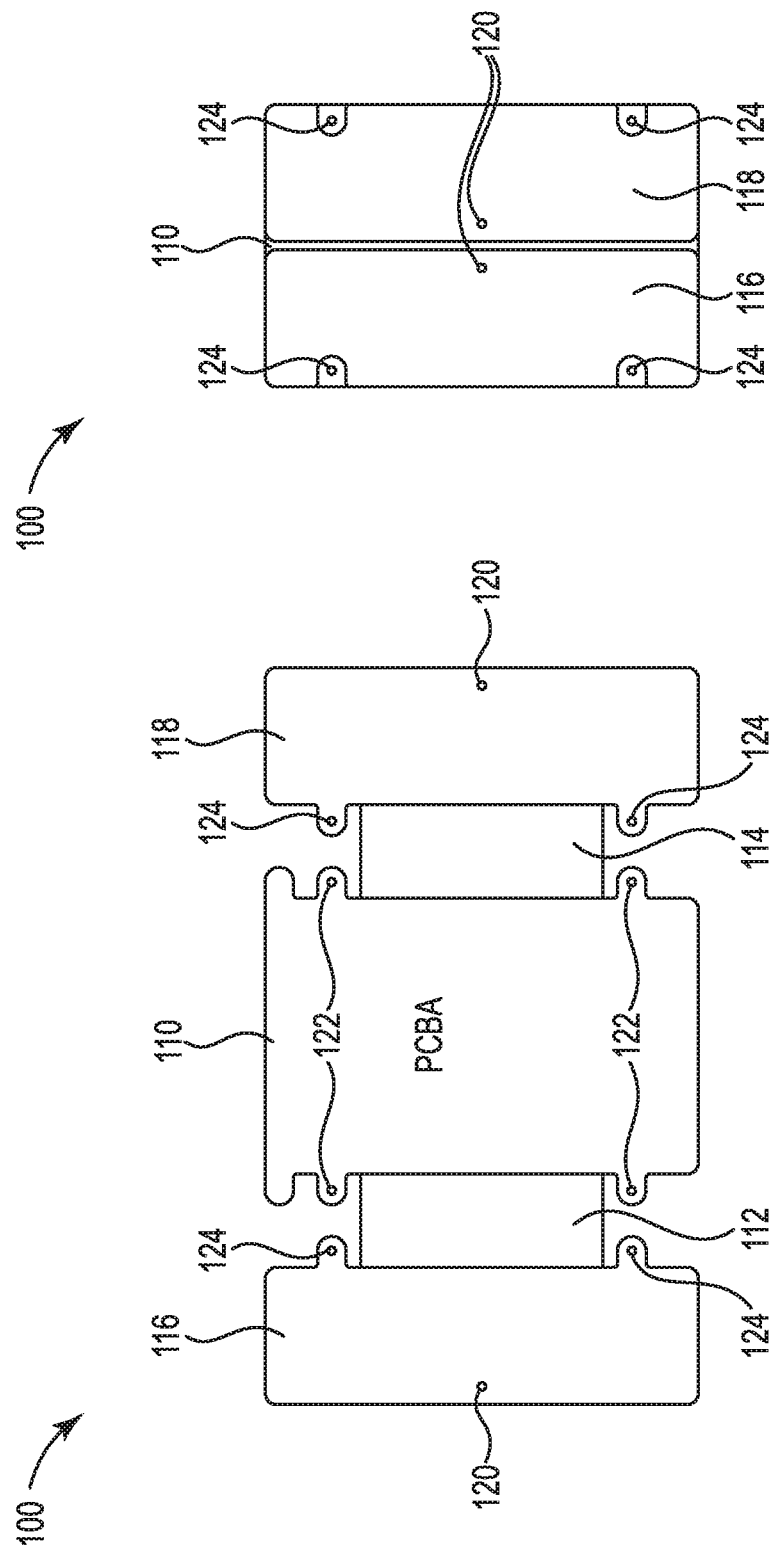

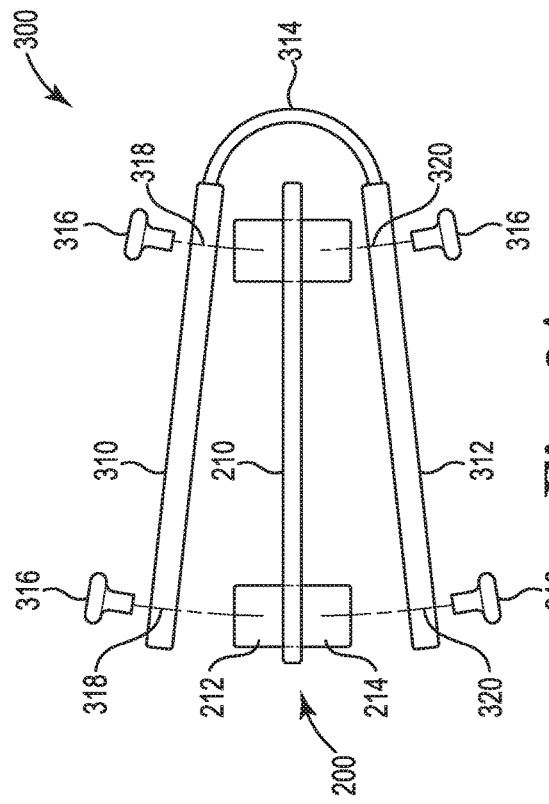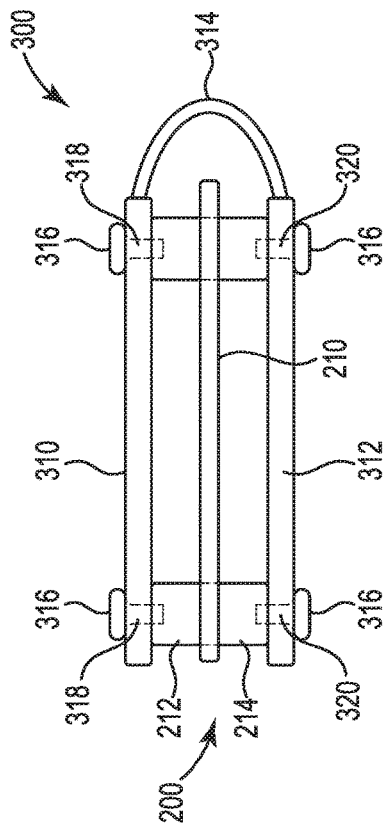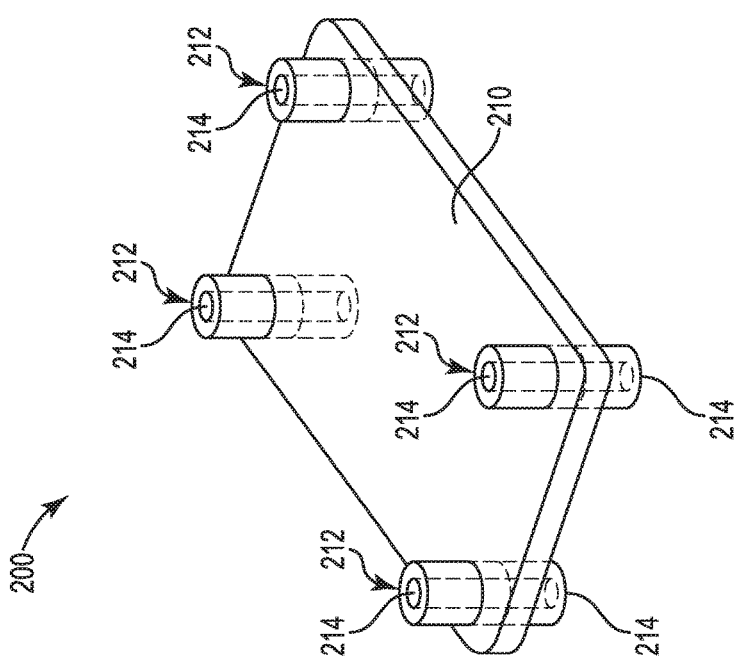

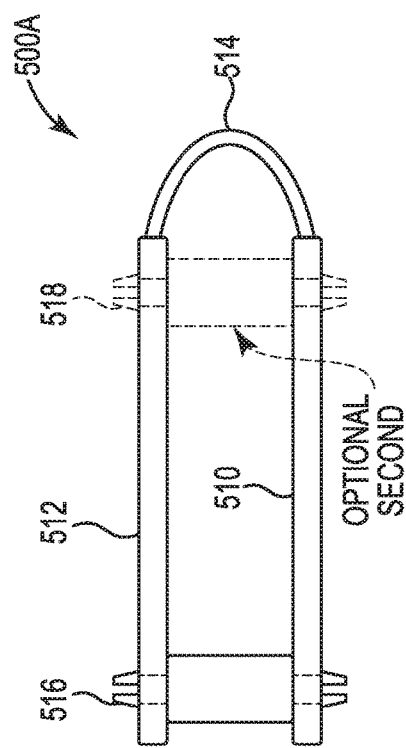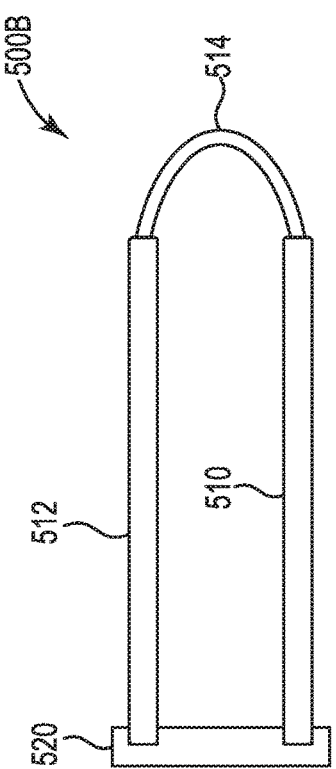

PCBA CARTRIDGE SUB-ASSEMBLY

BACKGROUND

Aspects of this disclosure are directed to printed circuit board assemblies, and in particular, manufacturing a storage device composed of multiple printed circuit boards.

Various challenges exist with regard to manufacturing and assembling printed circuit board assembly (PCBA)-based storage devices that include flexible or movable connections, especially with regard to speed and cost of assembly. Flexible connections may connect multiple storage device printed circuit boards (PCBs) or PCB surfaces, for example using a flexible cable. PCBs, as used herein, may be non-flexible or substantially rigid. One typical example of a storage device is a memory-based storage device, such as a solid state drive (SSD). SSDs may use non-volatile memory, such as NAND-based flash memory. Other examples of SSDs may utilize volatile random-access memory. Existing storage devices that use a flexible connection between multiple rigid PCB surfaces typically lack features to hold the boards in a fixed orientation prior to final assembly of a PCBA and installation of the PCBA into a housing.

Handling of a multiple-board, flexibly-connected PCBA during testing (e.g., by a technician or an appropriate machine) or assembly can be awkward and unpredictable due to free-moving parts and connections. For example, folding and placement of the PCBA boards during final assembly into the housing (e.g., a protective drive case) or the application of conductive/inductive dispensed thermal interface materials (TIM) can be inefficient due to undesired movement among parts. As a result, imprecision caused by various free-moving surfaces of the PCBA makes automated assembly or application of dispensed TIM challenging. As described herein, various methods and structures are desired to alleviate one or more of these problems.

SUMMARY

This disclosure describes a memory cartridge, a method of making a memory cartridge, and a chassis for use with a printed circuit board assembly.

In order to address the problem of imprecision caused by various free-moving surfaces of the PCBA during automated assembly or application of dispensed TIM, a space-defining element, such as a fixed, rigid chassis may be introduced to an otherwise flexible, multi-board storage device PCBA. Portions of the PCBA may be advantageously secured rigidly or fixedly during various steps of assembly. Securing the otherwise-movable parts of a flexible multi-board PCBA to a chassis may allow a simplified final assembly into an external case or enclosure to form an enclosed storage device. A specific enclosure and/or PCBA design may be configured or selected to suit embodiments described herein. Various embodiments of a chassis for securing PCBs may utilize fixed PCB spacers or PCB support pillars.

A first embodiment is directed to a method of making a memory cartridge. The method includes operatively coupling a first memory printed circuit board (PCB) to a second memory PCB, using a first flexible connection. The method also includes positioning a space-defining element relative to the first memory PCB and the second memory PCB. The method also includes securing, using the space-defining element, the first and second PCBs in a substantially fixed spaced relationship, where the spaced relationship defines a gap.

Variations of the first embodiment are also contemplated. According to one embodiment, a rigid chassis is employed as the space-defining element. According to another embodiment, at least one of the first and second memory PCBs is fastened to the rigid chassis. According to another embodiment, the memory cartridge may be placed inside a storage device housing configured to receive the memory cartridge by having at least one end that is open and sealing the memory cartridge inside the storage device housing with a cover configured to interface with the storage device housing. According to another embodiment, a third memory PCB is coupled to the first memory PCB using a flexible connection, where the third memory PCB is coplanar with the second memory PCB and where the second and third memory PCBs together form an outline substantially equal to an outline formed by the first memory PCB. According to another embodiment, a second space-defining element is positioned relative to the first memory PCB and a third memory PCB, and the first and third PCBs are secured using the space-defining element is a substantially fixed spaced relationship defining a gap. According to another embodiment, the first and second gap are filled with a thermal interface material.

A second embodiment is directed to a memory cartridge for use during assembly of a storage drive apparatus. The memory cartridge includes a first memory PCB. The memory cartridge also includes a second memory PCB, where the second memory PCB is operatively coupled to the first memory PCB by a first flexible connection. The memory cartridge also includes a chassis configured to fasten to the first memory PCB and to the second memory PCB such that the first and second memory PCBs have a spaced relationship to each other, and where the spaced relationship defines a gap.

Variations of the second embodiment are also contemplated. According to one embodiment of the memory cartridge, the chassis is a rigid chassis configured to cause the spaced relationship of the first and second memory PCBs to be fixed. According to another embodiment, the first and second memory PCBs are fixed in substantially parallel planes to each other. According to another embodiment, the rigid chassis includes at least one pin to guide alignment of the first and second memory PCBs to each other. According to another embodiment, a third memory PCB is included, and the first memory PCB is operatively coupled to the first memory PCB by a second flexible connection, where the chassis is further configured to fasten the third memory PCB such that the first and third memory PCBs have a spaced relationship to each other. Another embodiment further includes filling the gap between the first and second memory PCBs with a thermal interface material that interfaces with the first and second memory PCBs. According to another embodiment, the memory cartridge is configured to be placed in a storage device housing.

A third embodiment is directed to a chassis for use with a PCB assembly. The chassis includes a rigid frame. According to the third embodiment, the rigid frame is configured to interface with a plurality of PCBs. Also according to the third embodiment, the rigid frame is configured to fasten to one of a plurality of PCBs. And also according to the third embodiment, the rigid frame is configured to fixedly space the plurality of PCBs in a spaced relationship, where the spaced relationship defines a gap.

Variations of the third embodiment are also contemplated. According to one embodiment of the chassis, the gap of the spaced relationship is filled with thermal interface material, where the thermal interface material is interfaced with the first and second PCBs. Another embodiment includes at least one threaded hole configured to receive a screw to fasten the chassis to at least one PCB of the plurality of PCBs. According to another embodiment, the rigid frame is configured to fixedly space the plurality of PCBs in a parallel relationship. According to another embodiment, the rigid frame includes a first side and a second side, where at least one pillar spacer is located on each of the first side and the second side. According to another embodiment, the at least one spacer is configured to fasten to at least a first and second PCB of the plurality of PCBs.

These and various other features and advantages will be apparent from a reading of the following detailed description.

BRIEF DESCRIPTION OF THE DRAWINGS

The invention may be more completely understood in consideration of the following detailed description of various embodiments of the invention in connection with the accompanying drawing, in which:

FIGS. 1A-1B depict a printed circuit board assembly (PCBA) having multiple printed circuit boards (PCBs) with flexible connections, according to various embodiments.

FIG. 2 depicts a chassis for use with various multi-board PCBAs, according to various embodiments.

FIGS. 3A-3B depict a cartridge formed by attaching a multiple-board PCBA to a chassis, according to various embodiments.

FIGS. 5A-5B depict various multiple-board PCBA arrangements employing a space-defining element, according to various embodiments.

DETAILED DESCRIPTION

Figure 4A:
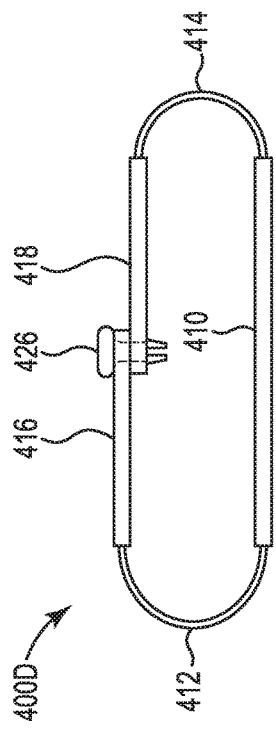
FIGS. 4A-4F depict various multiple-board PCBA arrangements employing a space-defining element, according to various embodiments.

The present disclosure provides for improvements to the fabrication and structure of printed circuit board assemblies (PCBAs), and in particular to efficiently manufacturing a storage device PCBA composed of multiple printed circuit boards (PCBs).

In the present description, reference is made to the accompanying drawings that form a part hereof and in which are shown by way of illustration at least one specific embodiment. The following description provides additional specific embodiments. It is to be understood that other embodiments are contemplated and may be made without departing from the scope or spirit of the present invention. The detailed description, therefore, is not to be taken in a limiting sense. While the present invention is not so limited, an appreciation of various aspects of the invention will be gained through a discussion of various examples.

An example PCBA having multiple boards (e.g., PCBs) may have a main board and one or more secondary boards, according to various configurations. The main board may be flexibly connected to the one or more secondary boards, and various secondary boards may be flexibly connected to other secondary (or tertiary) boards. Non-flexible connections may also be used in place of flexible connections, according to various embodiments.

As described herein, a space-defining element, such as a fixed, rigid chassis (e.g., a backbone, frame, or plate) may be introduced to an otherwise flexible, multi-board storage device PCBA. As described above, portions of the PCBA may be advantageously secured rigidly or fixedly during various steps of assembly. Securing the otherwise-movable parts of a flexible multi-board PCBA to a chassis may allow a simplified final assembly into an external case or enclosure to form an enclosed storage device. A specific enclosure and/or PCBA design may be configured or selected to suit embodiments described herein. Various embodiments of a chassis for securing PCBs may utilize fixed PCB spacers or PCB support pillars. According to some embodiments, grounding wings, for use in grounding various components to an enclosure or housing may be added to various PCBs.

According to other embodiments, instead of employing a separate rigid chassis, various fasteners may be used to securely hold two or more boards of the PCBA fixed with respect to one another. Various fasteners are contemplated having one or more pieces, and may include structures similar to a chassis as described herein.

Embodiments of a space-defining element, such as a chassis, may be varied in geometry in various dimensions to accommodate different PCBA styles, outlines, number of individual boards, etc. For example, one design uses a so-called rigid-flexible (a structure utilizing both rigid and flexible components) PCBA having two flexible regions connecting three boards, but a second PCBA design has only one flexible region between two boards and the plate would be modified to hold this board outline. Embodiments of the chassis may be roughly equivalent in outline size to various PCBA components, such as boards.

According to one embodiment, a PCBA having a flexible portion is secured to a rigid chassis, as described above, forming a single unitary cartridge. By forming the cartridge, simplified handling for testing and further assembly may be achieved. The chassis may take the form of a frame and may be configured to constrain the multi-board or flexible-connection based PCBA from shifting and may also reduce various risks of damage to the assembly. Such problems may include functional and non-functional physical damage to the electrical component packages on the PCBA, possibly resulting in immediate or eventual operational failure of the PCBA, or similar damage to the PCB itself. Other problems may include slow-down or increased handling difficulty in assembling the PCBA into an external case or enclosure while maintaining various required final drive dimension specifications. As a result, in the final stages of storage device assembly, the PCBA cartridge may be more easily placed into an external case or housing and secured to the housing as a single unit, among other things, as opposed to managing several components and securing them individually. By assembling the PCBA into a unit (cartridge), automated final assembly solutions may be made more efficient. Automated dispensing methods of TIM may also be facilitated for similar reasons. Various automated dispensing equipment may benefit from a fixed surface or part during application. Without described cartridge-securing method embodiments, the dispensing process would be less feasible for a PCBA having a flexible portion. Additionally, the cartridge method may help reduce the risk during handling of damaging or altering the dispensed TIM, in both form and location, which could otherwise reduce the thermal effectiveness of the TIM as a component in the drive. Without the various described cartridge-based approaches, these application techniques would generally be applied to a free-moving and/or angled surface, and they would likely not be applied with the same control and precision as the described embodiments of storage device cartridges would enable.

According to some embodiments, locating features, such as protruding pins, slots, guides, etc., may be added to a main PCB in order to locate a chassis and/or a secondary board proximate to the main PCB, and to align the various boards and chassis for fastening or assembly. Various PCBs may also include holes (threaded or otherwise) or openings for use in fastening to other PCBs, a chassis, or other components.

FIGS. 1A-1B depict a PCBA 100 having multiple PCBs with flexible connections, according to various embodiments.

FIG. 1A depicts a three-board PCBA 100 having a main board 110, and two secondary boards 116 and 118. Secondary board 116 is connected to main board 110 by flexible connection 112, and likewise secondary board 118 is connected to main board 110 by flexible connection 114. Flexible connections 112 and 114 may operatively couple main board 110 to secondary board 116 and 118, including the transmission of electricity, light, and/or signals, according to various embodiments. Flexible connections, as used herein, may include ribbon cables, other flat cables, any of various types of flexible PCBs, among other flexible connections.

The flexible connections 112 and 114, in order to operatively couple various boards to one another (such as the main board 110 to a secondary board 116 or 118), may utilize various operative connectors, fasteners, and/or bonding methods. For example, plastic snap-type fasteners that are configured to slide into an opening and spring open once through may be used to secure a flexible connection 112 or 114 to various boards. Alternatively a friction based male-female type socket connector using a snap-type fastener (e.g., including a detent) may be used to securely fasten a flexible connection 112 or 114, whether removable or otherwise. Another way in which the flexible connections 112 or 114 may operatively connect various boards is by bonding, such as wire bonding or soldering, among others.

As described herein, various components may be used for fastening or locating parts during assembly of the PCBA 100. In the shown embodiment, screw holes 122 are shown located on main board 110, and screw holes 124 are shown located on secondary boards 116 and 118. Guide pins and/or holes may also be utilized during assembly of PCBA 100, such as guide pins 120 shown on secondary boards 116 and 118.

FIG. 1B depicts the PCBA 100 shown in FIG. 1A, in a second step where secondary boards 116 and 118 are folded over main board 110 using the flexible connections 112 and 114 (not shown, see FIG. 1A). Guide pins 120 may facilitate proper alignment of the secondary boards 116 and 118 with respect to main board 110. Additionally, screw holes 122 (not shown, see FIG. 1A) and 124 may be aligned and a screw may be inserted. Screw holes may instead use pins, etc., according to other embodiments.

FIG. 2 depicts a chassis 200 for use with various multiboard PCBAs, according to various embodiments. In contrast to FIG. 1, as shown, a chassis 200 may be employed and positioned proximate various boards as a spacer device to locate and/or fasten the various boards in fixed or spaced relation, as opposed to directly fastening or connecting boards to one another.

As illustrated, chassis 200 includes a substantially planar main plate 210 having a first and a second side, along with various pillar spacers 214 each having a hole 212. Pillar spacers 214 may be located on the first side and the second side of main plate 214, according to the shown embodiment.

According to other embodiments, the pillar spacers 214 may be located at various other locations of the main plate 214. For example, four pillar spacers 214 may be located on each side of the main plate 214, as depicted in the present embodiment. As mentioned, each pillar spacer 214 may have a hole 212 thereon. Each hole 212 may be threaded, for use with a fastener, such as a screw. Pillar spacers 214 may be connected to the main plate 210, or may be integral to the main plate 210. Chassis 200 and pillar spacers 214 may be made of any of various suitable materials, including metal, plastic, etc., as appropriate. Chassis 200 depicts one of a multitude of different chassis configurations, as contemplated herein.

FIGS. 3A-3B depict a cartridge 300 formed by attaching a multiple-board PCBA to a chassis, according to various embodiments.

FIG. 3A depicts a chassis, such as chassis 200 of FIG. 2, in an expanded view with a multiple-board PCBA located in close relation thereto, as may occur during an assembly step to form a multiple-PCBA storage device cartridge 300. As described in FIG. 2, chassis 200 includes a main plate 210, and pillar spacers 212 and 214, according to various embodiments.

First board 310, which may be a main board, according to various embodiments, is located above chassis 200. Second board 312, which may be a secondary board, according to various embodiments, is located below chassis 200. Fasteners 316, such as screws, bolts, or snap-type fasteners, are positioned proximate to first board 310 holes 318 and second board 312 holes 320. Adhesives, epoxy, or welding techniques, among others, may also be used to fasten, according to other embodiments. A flexible connection 314 is shown connecting first board 310 to second board 312, which may form a PCBA.

FIG. 3B depicts the PCBA and chassis 200 of FIG. 3A, in an example complete, fastened cartridge 300 arrangement. Fasteners 316 are configured to fasten first board 310 to chassis 200, and to fasten second board 314 to chassis 200, by fastening the first and second boards 310, 312 to the support pillars 212, 214, using fasteners 316 through holes 318, 320. Main plate 210 may add rigidity and structure to cartridge 300.

FIGS. 4A-4F depict various multiple-board PCBA arrangements employing a space-defining element, according to various embodiments.

Specifically, FIGS. 4A-4F depict various multiple-board PCBA arrangements 400A-400F having three boards, including a main board 410 and secondary boards 416 and 418. Main board 410 is flexibly connected to secondary boards by flexible connections 412 and 414. Flexible connections 412 and 414 may be configured to operatively couple, as described herein, main board 410 to secondary boards 416 and 418, and may be configured to transmit electricity, light, and/or signals, according to various embodiments.

FIG. 4A depicts an embodiment 400A where a space-defining element, fastener 420, connects secondary boards 416 and 418 in an offset, partially overlapping configuration. Fastener 420 may be shallow, and may only partially slot secondary boards 416 and 418 into the fastener 420. As used herein, partial slotting may denote that a fastener 420 may not extend over an entire board edge, in a shallow opening. Fastener 420 may fasten to secondary board 416 and 418 through friction, slotting, and/or other fastening configurations. Boards 416 and 418 may be of different sizes than each other, according to various embodiments.

A first space-defining element 420 may be positioned relative to the first memory PCB 410 and a second memory PCB (a first secondary board 416), and the first 410 and second PCBs 416 may be secured using the first space-defining element 420 in a substantially fixed spaced relationship, wherein the spaced relationship defines a first gap, which may optionally be filled with TIM. The first 420 or a second space-defining element (not shown) may be positioned relative to the first memory PCB 410 and a third memory PCB (a second secondary board 418), and the first 410 and third PCBs 418 may be secured using the first 420 or second space-defining element in a substantially fixed spaced relationship, wherein the spaced relationship defines a second gap, which may optionally be filled with TIM.

Figure 4B:
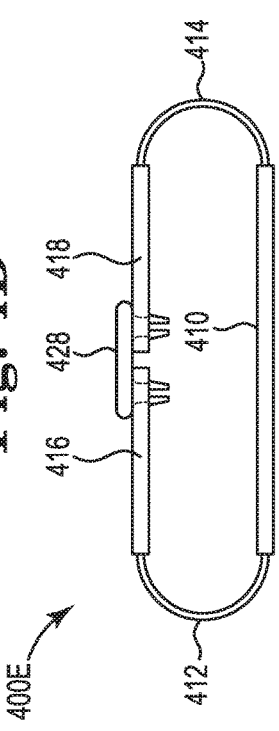

FIG. 4B depicts another embodiment 400B where a fastener 422 connects secondary boards 416 and 418 in a coplanar, enclosed, and fully slotted arrangement in contrast to the partial slotted arrangement of FIG. 4A, for example. Fastener 422 may fasten to secondary board 416 and 418 through friction, slotting, and/or other fastening configurations, where the boards 416 and/or 418 are fully inserted into fastener 422, exposing only ends of the boards to which the flexible connections 412 and 414 are coupled.

Figure 4C:
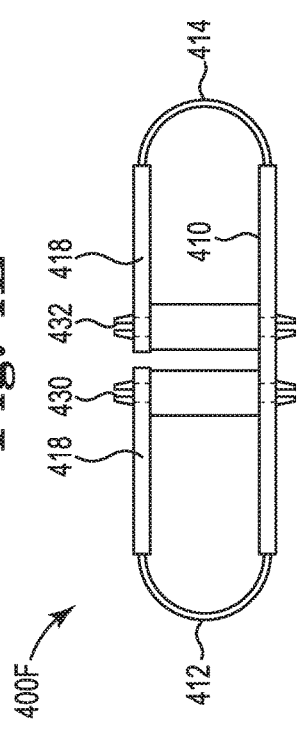

FIG. 4C depicts another embodiment 400C where a fastener 424 connects secondary boards 416 and 418 in a coplanar, partially slotted arrangement similar to the embodiment shown in FIG. 4B, but where a shallow, coplanar partially slotting fastener 424 is used. In this embodiment, partially slotting secondary boards 416 and 418 into the fastener is shown. Fastener 440 may fasten to secondary board 416 and 418 through friction, slotting, adhesives, and/or other fastening configurations.

Figure 4D:
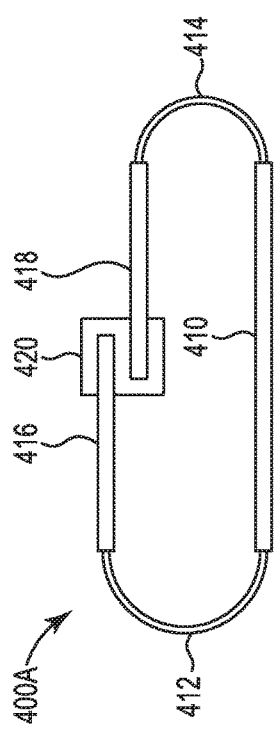

FIG. 4D depicts another embodiment 400D where a snap-type fastener 426 connects secondary boards 416 and 418 in an offset, partially overlapping configuration. Fastener 426, as shown, may penetrate both secondary boards 416 and 418 using a single fastener, and may hold or secure the secondary boards 416 and 418 to each other using holes or openings, for example. According to other embodiments, additional snap-type fasteners may be employed similar to fastener 426 along both ends, and may increase rigidity of the PCBA.

Figure 4E:
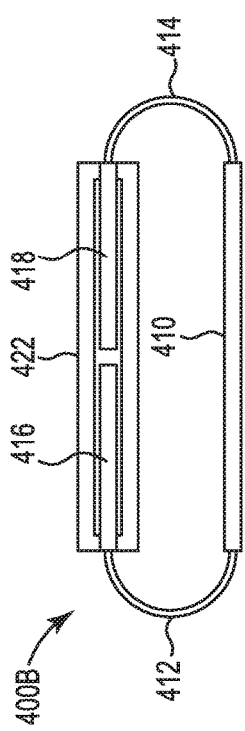

FIG. 4E depicts another embodiment 400E where a bridging, dual-connector snap-type fastener device 428 connects secondary boards 416 and 418 in a proximate, coplanar arrangement. Device 428, as shown, may penetrate both secondary boards 416 and 418 individually using separate snap-type fasteners, and may hold or secure the secondary boards 416 and 418 to each other. According to other embodiments, additional devices 428 may be employed, and may increase rigidity of the PCBA.

Figure 4F:
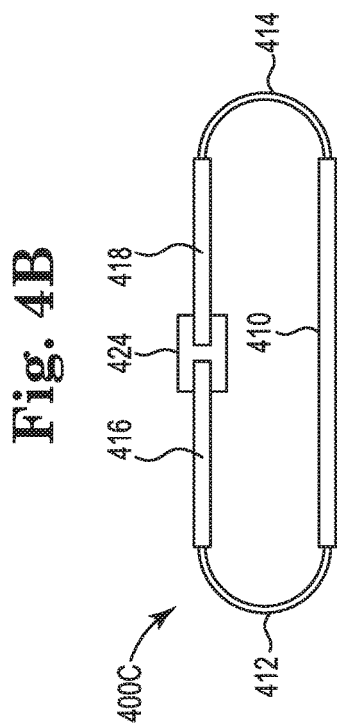

FIG. 4F depicts another embodiment 400F where two snap-type fasteners 430 and 432 connect secondary boards 416 and 418, respectively, to main board 410. A snap-type fastener may take various forms, as described herein, including a pin with one or more deflective legs that are configured to operate with catch portions. Snap-type fasteners may be composed of various materials, including various plastics, metals, etc. Secondary boards 416 and 418 as shown, may be located in a proximate, coplanar arrangement when fastened. Fasteners 430 and 432 may be substantially similar in construction, and may utilize a strut-type or other support pillar to fixedly space the respective secondary board, 416 or 418, from the main board 410. Fasteners 430 and 432 may utilize a dual-ended snap-type fastener, and each may penetrate both the main board 410 and a secondary board, 416 or 418.

Though various embodiments are shown, it is contemplated that other variations, using various described components in other arrangements or using other desirable components are also within the scope of this disclosure.

FIGS. 5A-5B depict various multiple-board PCBA arrangements employing a space-defining element, according to various embodiments.

Specifically, FIGS. 5A-5B depict various multiple-board PCBA arrangements 500A-500B having two boards, including a main board 510 and a secondary board 512. Main board 510 is flexibly connected to the secondary board 512 by flexible connection 514. Flexible connection 514 may be configured to operatively couple main board 510 to secondary board 512, and may be configured to transmit electricity, light, and/or signals, according to various embodiments, as described herein.

FIG. 5A depicts an embodiment 500A where a space-defining element, in this case snap-type fastener 516, connects secondary board 512 directly to the main board 510 in an optionally parallel, and optionally fixed spaced configuration or relationship, defining a gap between the boards. Fastener 516 may be substantially similar to fasteners 430 and 432, and may utilize a support pillar portion to fixedly space the secondary board 512 from the main board 510. Fastener 516 may utilize a dual-ended snap-type fastener, which may penetrate both the main board 510 and a secondary board 512. Main board 510 and secondary board 512 may be configured to utilize fastener 516 to substantially align the boards in a spaced parallel arrangement, defining a gap. The gap may optionally be filled with TIM, which may interface thermally with one or more boards. A second fastener 518 may be optionally included to increase the rigidity between the main board 510 and the secondary board 512. The second fastener 518 may be located at various positions, including near the first fastener 516, or distant from the first fastener 516. Additional fasteners may also be added, according to various embodiments.

FIG. 5B depicts an embodiment 500B where a fastener 520 connects secondary board 512 directly to the main board 510 in a parallel and fixed spaced relationship, defining a gap. The configuration may be similar to the configuration shown in FIG. 5A. Fastener 520 may operate on a similar principle to the fasteners shown in FIGS. 4A-4C. According to the shown embodiment, fastener 520 may partially receive main board 510 and secondary board 512 in respective slots, and fastener 520 may hold the respective boards in place through friction, slotting, etc. Using fastener 520 may have various benefits, including facilitating installation and/or removal of the respective board FIGS. 6A-6G depict steps in an assembly process of a cartridge using a rigid chassis, according to various embodiments.

Figure 6B:
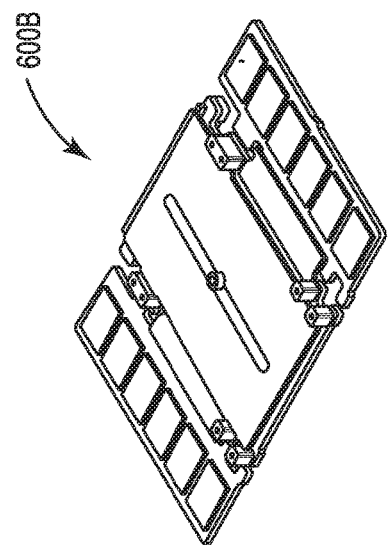
FIGS. 6A-6G depict steps in an assembly process of a cartridge using a rigid chassis, according to various embodiments.
Figure 6D:
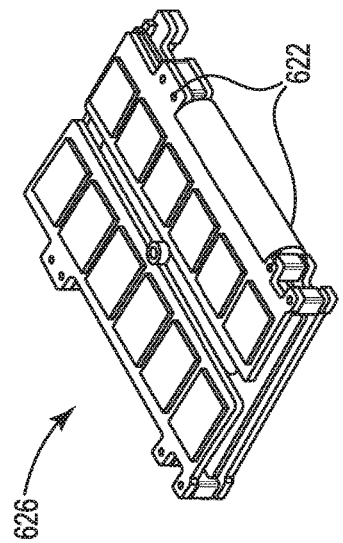
Figure 6A:
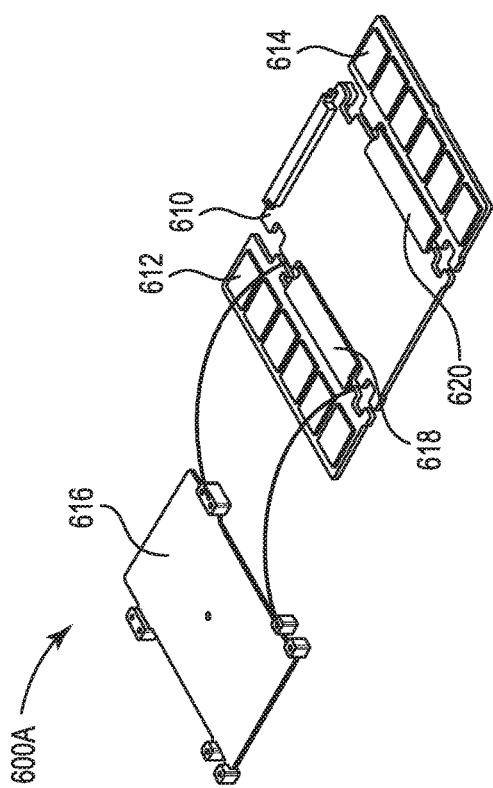

FIG. 6A depicts a first step 600A, where a PCBA begins in a relatively flat (planar), open arrangement (similar to FIG. 1A), including main board 610, and secondary boards 612 and 614 connected to main board 610 using flexible connections 618 and 620, respectively. At this stage, TIM may optionally be applied to various main board components. Chassis 616, a space-defining element, may be placed onto main board of PCBA, preferably using four locating pins to guide placement, according to the shown embodiment, with final placement depicted in FIG. 6B. Chassis 616 may be a variation similar to chassis 200, as described herein.

FIG. 6B depicts a second step 600B, where the chassis 616 is shown in place on top of main board 610, covering main board. Chassis 616 may optionally be attached or fastened to main board 610 or other components at this stage. TIM may optionally be applied to secondary boards or other accessible areas or components before proceeding.

Figure 6C:
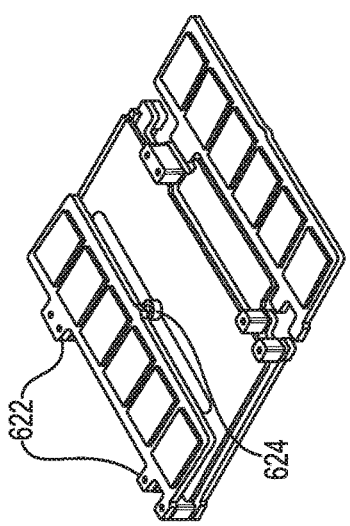

FIG. 6C depicts a third step 600C, where secondary board 612 is articulated to relative to chassis 616 by virtue of a flexible nature of the flexible connector 618, on flexible connection 618 and folds over chassis 616. The secondary board 612 may be held against center backbone of chassis while two fasteners (e.g., screws) are optionally applied.

FIG. 6D depicts a fourth step 600D, where secondary board 614 pivots on flexible connection 620 and folds over chassis 616, similar to secondary board 612 in the previous step. Secondary board 614 may then be held against center of chassis 616 while plural fasteners (e.g., screws) are applied to holes 622 to secure secondary board 614 to chassis 616 and/or main board 610. At this stage, an additional fastener (e.g., a screw) may be applied at a center of chassis 616 at 624 in order to improve rigidity of the assembly and provide a more secure connection of various components. At this stage, a cartridge 626 sub-assembly may be completed. The cartridge 626 may now be treated (transported, etc.) in a similar fashion to various optionally non-flexible, single board PCBA configurations (e.g., a 7 mm single PCB configuration) and may optionally be set into a cast housing enclosure with an applied cover, for the purposes of assembly or installation.

Figure 6F:
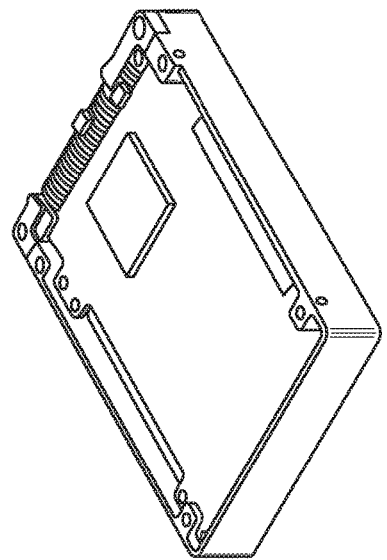
Figure 6G:
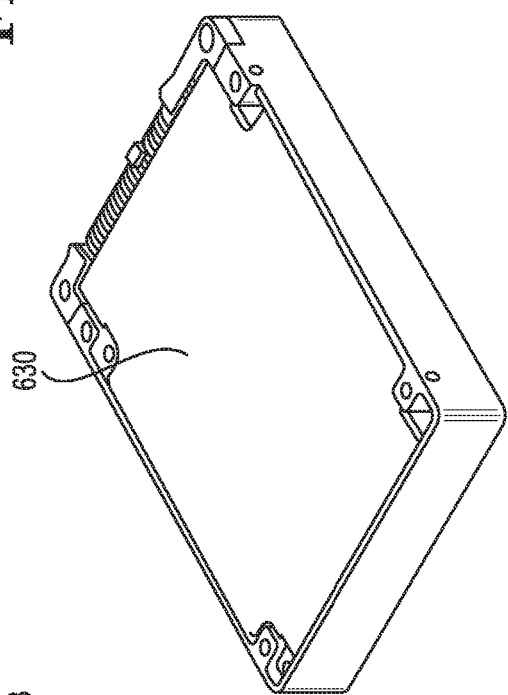
Figure 6E:
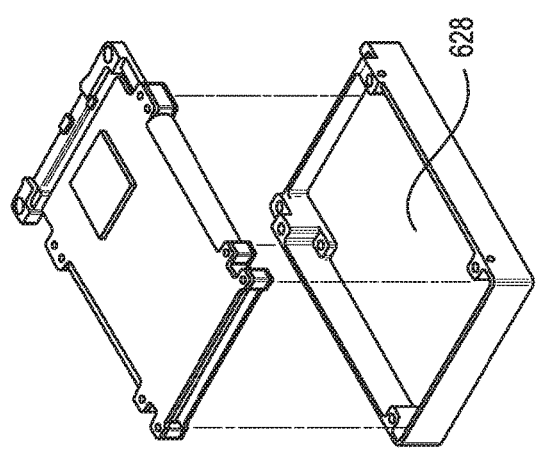

FIG. 6E depicts a fifth step 600E, where cartridge 626, completed at FIG. 6D, is inserted into a storage drive housing 628. Cartridge 626 may optionally be fastened to drive housing 628. TIM may optionally be applied to accessible components and/or surfaces at this stage.

FIG. 6F depicts a sixth step 600F, where cartridge 626 is shown installed in drive housing 628.

FIG. 6G depicts a seventh step 600G, where a drive housing cover 630 is applied to drive housing 628, sealing cartridge 626 inside. According to one embodiments, cover 630 may be set into place on the PCBA cartridge 626 and housing 628. Pressure may be applied while fastening the cover 630 to the housing 628 and/or cartridge 626. In one embodiment, four appropriately long screws may secure cover 630, cartridge 626, and chassis 616 to the enclosure 628 at various common points. In one embodiments, two fasteners (e.g., screws) may secure a PCBA connector located on cartridge 626 to enclosure 628. Cover 630 may be made using a stamped construction, according to various embodiments.

Figure 7:
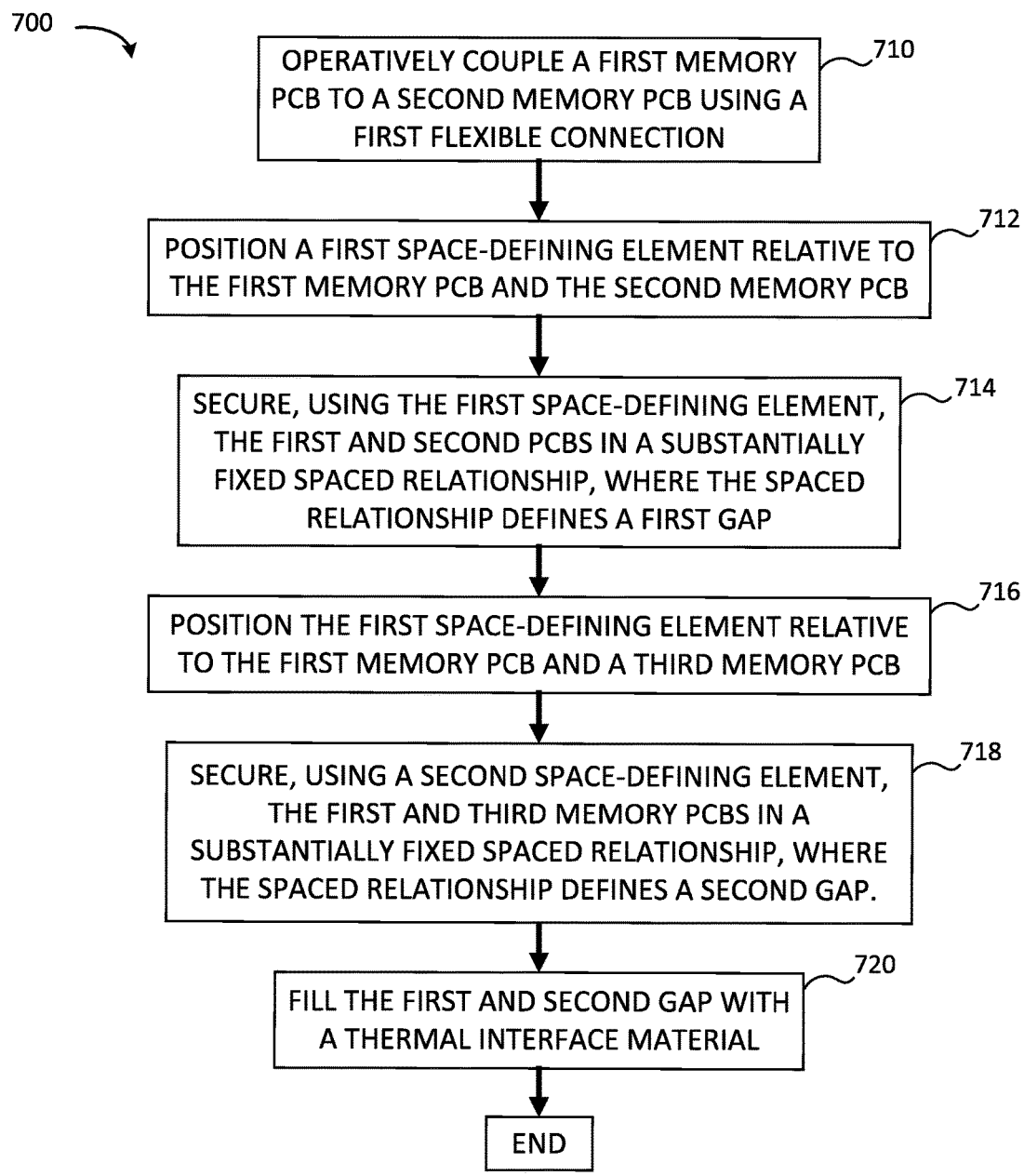
FIG. 7 is a flowchart of a method of making a memory cartridge, according to various embodiments.

FIG. 7 is a flowchart of a method 700 of making a memory cartridge, according to various embodiments. Method 700 can begin at operation 710, where a first memory PCB is operatively coupled to a second memory PCB using a first flexible connection. Method 700 can then proceed to operation 710, where a first space-defining element is positioned relative to the first memory PCB and the second memory PCB. Method 700 can then proceed to operation 714, where the first and second PCBs are secured using the first space-defining element in a substantially spaced relationship. According to various embodiments, the spaced relationship defines a first gap. Following operation 714, at operation 716, the first space-defining element is used to secure the first and third memory PCBs in a substantially fixed spaced relationship, where the spaced relationship defines a second gap. Following operation 718, at operation 720 the first and second gaps are filled with a thermal interface material. Following operation 720, the method 700 may end.

It is understood that numerous variations of PCBA cartridges could be made while maintaining the overall inventive design and remaining within the scope of the disclosure. Numerous alternate design or element features have been mentioned above.

As used herein, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Unless otherwise indicated, all numbers expressing feature sizes, amounts, and physical properties are to be understood as being modified by the term "about." Accordingly, unless indicated to the contrary, the numerical parameters set forth are approximations that can vary depending upon the desired properties sought to be obtained by those skilled in the art utilizing the teachings disclosed herein.

Thus, embodiments of the rigid chassis for use in a PCBA assembly is disclosed. The implementations described above and other implementations are within the scope of the following claims. One skilled in the art will appreciate that the present invention can be practiced with embodiments other than those disclosed. The disclosed embodiments are presented for purposes of illustration and not limitation, and the present invention is limited only by the claims that follow.

What is claimed is:

1. A method of making a memory cartridge, comprising:
operatively coupling a first memory printed circuit board (PCB) to a second memory PCB, using a first flexible connection, wherein the first flexible connection connects using a male-female type socket for operative connection, and wherein the first flexible connection is configured to allow the second memory PCB to fold with respect to the first memory PCB;
positioning a first space-defining element relative to the first memory PCB and the second memory PCB, wherein once positioned, the first space-defining element is spaced from the first flexible connection;
folding the second memory PCB with respect to the first memory PCB using the first flexible connection while the first memory PCB remains operatively coupled to the second memory PCB; and
securing, using the first space-defining element, the first and second PCBs in a substantially fixed spaced relationship, wherein the spaced relationship defines a first gap between the first space-defining element and the first and second PCBs.

2. The method of claim 1, further comprising fastening at least one of the first and second memory PCBs to the first space-defining element, wherein the first space-defining element is a rigid chassis.

3. The method of claim 1, further comprising:
placing the memory cartridge inside a storage device housing configured to receive the memory cartridge by having at least one end that is open; and
sealing the memory cartridge inside the storage device housing with a cover configured to interface with the storage device housing.

4. The method of claim 1, further comprising:
operatively coupling a third memory PCB to the first memory PCB using a second flexible connection, wherein the second flexible connection is configured to allow the third memory PCB to fold with respect to the first memory PCB; and
folding the third memory PCB with respect to the first memory PCB using the second flexible connection while the first memory PCB remains operatively coupled to the third memory PCB;
wherein the third memory PCB is coplanar with the second memory PCB;
wherein the second and third memory PCBs together form an outline not greater than an outline formed by the first memory PCB.

5. The method of claim 4, further comprising:
positioning a second space-defining element relative to the first memory PCB and a third memory PCB; and
securing, using the second space-defining element, the first and third PCBs in a substantially fixed spaced relationship, wherein the spaced relationship defines a second gap between the second space-defining element and the first and third PCBs.

6. The method of claim 5, further comprising filling the first gap and the second gap with a thermal interface material, and wherein the thermal interface material is thermally interfaced with the first, second, and third memory PCBs.

7. The method of claim 4, wherein the second and third memory PCBs together form an outline substantially equal to an outline formed by the first memory PCB.

8. The method of claim 5, wherein the first space-defining element and the second space-defining element are the same space-defining element.

9. The method of claim 1, wherein the male-female type socket uses a friction-based connection.

10. The method of claim 1, wherein the male-female type socket of the first or second memory PCB uses a plastic snap-type fastener that is configured to slide into an opening and spring open once through the other memory PCB.

11. A memory cartridge for use during assembly of a storage drive apparatus, comprising:
a first memory printed circuit board (PCB);
a second memory PCB, wherein the second memory PCB is operatively coupled to the first memory PCB by a first flexible connection, wherein the first flexible connection is configured to allow the second memory PCB to fold with respect to the first memory PCB while operatively coupled; and
a chassis configured to fasten to the first memory PCB and to the second memory PCB such that the first and second memory PCBs have a spaced relationship to each other, wherein the spaced relationship defines a first gap between the chassis and the first and second PCBs, and wherein the chassis is spaced from the first flexible connection.

12. The memory cartridge of claim 11, wherein the chassis is a rigid chassis configured to cause the spaced relationship of the first and second memory PCBs to be fixed in substantially parallel planes to each other.

13. The memory cartridge of claim 11, further comprising:
a third memory PCB, wherein the third memory PCB is operatively coupled to the first memory PCB by a second flexible connection, wherein the second flexible connection is configured to allow the third memory PCB to fold with respect to the first memory PCB while operatively coupled; and
wherein the chassis is further configured to fasten the third memory PCB such that the first and third memory PCBs have a spaced relationship to each other, wherein the spaced relationship defines a second gap between the chassis and the first and third PCBs, and wherein the chassis is spaced from the second flexible connection.

14. The memory cartridge of claim 13, further comprising:
a thermal interface material filling the second gap, and wherein the thermal interface material is thermally interfaced with the first and third memory PCBs.

15. The memory cartridge of claim 11, further comprising:
a thermal interface material filling the first gap, and wherein the thermal interface material is thermally interfaced with the first and second memory PCBs.

16. The memory cartridge of claim 11, wherein the memory cartridge is configured to be placed in a storage device housing.

17. A chassis for use with a printed circuit board assembly, comprising:
a rigid frame having a first side and a second side; and
a plurality of pillar spacers extending from the rigid frame, the plurality of pillar spacers configured to interface with a plurality of printed circuit boards (PCBs);
wherein a first group of pillar spacers are located on the first side of the rigid frame and a second group of pillar spacers are located on the second side of the rigid frame;
wherein the first group of pillar spacers is configured to fasten to a first PCB of the plurality of PCBs;
wherein the second group of pillar spacers is configured to fasten to a second PCB of the plurality of PCBs;
wherein the rigid frame is configured to locate and fixedly space each PCB of the plurality of PCBs in a spaced relationship, wherein the spaced relationship defines a gap between the rigid frame and the first and second PCB.

18. The chassis of claim 17, wherein the gap is filled with thermal interface material, and wherein the thermal interface material is thermally interfaced with the first and second PCBs.

19. The chassis of claim 17, wherein the rigid frame is further configured to fixedly space the plurality of PCBs in a parallel relationship.

20. The chassis of claim 17, wherein each pillar spacer of the plurality of pillar spacers includes a threaded hole.

* * * * *